(12) United States Patent
Saito et al.

(10) Patent No.: US 9,464,191 B2
(45) Date of Patent: Oct. 11, 2016

(54) SILICON-CONTAINING CURING COMPOSITION AND CURED PRODUCT THEREOF

(75) Inventors: Masako Saito, Tokyo (JP); Ryota Chiba, Tokyo (JP); Takuya Kanazawa, Tokyo (JP); Ichiro Hiratsuka, Tokyo (JP); Takaaki Kanbayashi, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 10 days.

(21) Appl. No.: 14/236,214

(22) PCT Filed: Jun. 5, 2012

(86) PCT No.: PCT/JP2012/064431
§ 371 (c)(1),
(2), (4) Date: Jan. 30, 2014

(87) PCT Pub. No.: WO2013/021717
PCT Pub. Date: Feb. 14, 2013

(65) Prior Publication Data
US 2015/0158982 A1    Jun. 11, 2015

(30) Foreign Application Priority Data

Aug. 10, 2011   (JP) ................. 2011-174608

(51) Int. Cl.
| | | |
|---|---|---|
| C08L 83/04 | (2006.01) | |
| C08K 3/36 | (2006.01) | |
| C08K 9/06 | (2006.01) | |
| H01L 23/29 | (2006.01) | |
| C08K 5/14 | (2006.01) | |
| C08K 5/01 | (2006.01) | |
| C08K 5/3492 | (2006.01) | |
| C08K 5/549 | (2006.01) | |
| C08G 77/20 | (2006.01) | |
| C08K 5/56 | (2006.01) | |
| H01L 33/56 | (2010.01) | |
| C08K 3/22 | (2006.01) | |

(52) U.S. Cl.
CPC ............... C08L 83/04 (2013.01); C08K 3/36 (2013.01); C08G 77/20 (2013.01); C08K 5/01 (2013.01); C08K 5/14 (2013.01); C08K 5/34924 (2013.01); C08K 5/549 (2013.01); C08K 5/56 (2013.01); C08K 9/06 (2013.01); C08K 2003/2241 (2013.01); H01L 23/296 (2013.01); H01L 33/56 (2013.01)

(58) Field of Classification Search
None
See application file for complete search history.

(56) References Cited

U.S. PATENT DOCUMENTS

| | | | |
|---|---|---|---|
| 4,336,309 A | 6/1982 | Jackel et al. | |
| 6,890,662 B2 | 5/2005 | Yaginuma et al. | |
| 7,153,583 B2 * | 12/2006 | Azechi et al. | 428/447 |
| 7,560,145 B2 * | 7/2009 | Ouchi et al. | 428/1.1 |
| 8,003,736 B2 | 8/2011 | Sueyoshi et al. | |
| 8,658,755 B2 * | 2/2014 | Saito | 528/37 |
| 8,809,478 B2 * | 8/2014 | Saito et al. | 528/24 |
| 8,840,999 B2 | 9/2014 | Harimoto et al. | |
| 2003/0232202 A1 | 12/2003 | Yaginuma et al. | |
| 2007/0112147 A1 * | 5/2007 | Morita et al. | 525/478 |
| 2008/0255321 A1 | 10/2008 | Nakashima et al. | |
| 2009/0012256 A1 | 1/2009 | Omi et al. | |
| 2010/0059177 A1 | 3/2010 | Kashiwagi | |
| 2011/0223421 A1 | 9/2011 | Harimoto et al. | |
| 2012/0029151 A1 * | 2/2012 | Takanashi et al. | 525/55 |
| 2012/0157624 A1 | 6/2012 | Saito | |
| 2012/0261068 A1 | 10/2012 | Kashiwagi | |
| 2013/0082369 A1 * | 4/2013 | Kokubo et al. | 257/666 |

FOREIGN PATENT DOCUMENTS

| | | |
|---|---|---|
| CN | 101111565 | 1/2008 |
| CN | 101671483 | 3/2010 |
| CN | 102272231 | 12/2011 |
| EP | 0 598 627 | 5/1994 |
| JP | 56-076469 | 6/1981 |
| JP | 57-180639 | 11/1982 |
| JP | 06-207104 | 7/1994 |
| JP | 08-73743 | 3/1996 |
| JP | 2000-160017 | 6/2000 |
| JP | 2002-194218 | 7/2002 |
| JP | 2004-018701 | 1/2004 |
| JP | 2004-107577 | * 4/2004 |
| JP | 2005-068295 | 3/2005 |
| JP | 2006-089532 | 4/2006 |
| JP | 2007-332259 | 12/2007 |
| JP | 2009-120732 | 6/2009 |
| TW | 200911885 | 3/2009 |
| WO | WO 2006/090609 | 8/2006 |
| WO | 2011048894 | 4/2011 |
| WO | WO 2011/048894 | * 4/2011 |
| WO | WO 2011/155459 | * 12/2011 |

OTHER PUBLICATIONS

International Search Report, PCT/JP2012/064431, Sep. 11, 2012.

* cited by examiner

Primary Examiner — Marc Zimmer
(74) Attorney, Agent, or Firm — Young & Thompson

(57) ABSTRACT

A silicon-containing curing composition including a specific amount of a silicon-containing polymer having an Mw of 300 to 100,000 obtained by hydrolysis and condensation of an organosilane mixture containing specific amounts of organosiloxanes of formulae (1-1) through (1-5); a specific amount of a prepolymer containing at least two Si—H groups per molecule obtained by hydrosilylation between a cyclic siloxane compound of formula (2) and a compound of formula (3-1), (3-2), or (3-3); a specific amount of a linear siloxane compound containing more than one carbon-carbon double bond reactive with Si—H or Si—CH$_3$ per molecule; specific amounts of an organic peroxide and a metal catalyst; and a specific amount of a filler. The details for the formulae (1-1) to (1-5), (2), (3-1) to (3-3) are as described in the specification.

10 Claims, No Drawings

SILICON-CONTAINING CURING COMPOSITION AND CURED PRODUCT THEREOF

TECHNICAL FIELD

This invention relates to a silicon-containing curing composition and a cured product obtained therefrom. The silicon-containing curing composition and the cured product of the invention are useful as a semiconductor-related material, particularly a package material or a lead frame material for LEDs and the like.

BACKGROUND ART

Various studies have been conducted on silicon-containing compounds. Polysiloxane compounds typified by silicone resins have been long made use of on an industrial scale. Although silicone resins are excellent in heat resistance and flexibility, they have a high content of an outgassing component (a high volatile content) and therefore has a limited use because of possible contamination which is a problem particularly in the manufacture of electronic components.

In view of the increasing demand for various materials used in the electronic information field to have higher performance with the technical development, investigations have been directed to materials which take advantage of the feature of silicon in exhibiting excellent heat resistance and physical and electrical characteristics. In this connection, various techniques for producing a useful compound using a hydrosilylation reaction of a silicon compound have been studied. In the manufacture of electronic information components, in which a lithography system is frequently used, higher resistance to bases and solvents has been required of materials therefor. Therefore, there has been a demand for materials exhibiting high heat resistance and crack resistance while retaining high resistance to bases and solvents. To meet the demands, various silicon-containing curing compositions have been proposed (see, e.g., patent documents 1 to 7 below).

While the proposed techniques have their own characteristics, they are still unsatisfactory in terms of the performance required in the recent electronic information field, such as heat resistance, light resistance, crack resistance, colorability, and the like.

CITATION LIST

Patent document 1: EP 0598627
Patent document 2: JP 8-73743A
Patent document 3: JP 2004-107577A
Patent document 4: JP 2005-68295A
Patent document 5: US 2009/012256
Patent document 6: JP 2007-332259A
Patent document 7: JP 2009-120732A

SUMMARY OF THE INVENTION

Problem to be Solved by the Invention

An object of the invention is to provide a silicon-containing curing composition and a cured product thereof that are excellent in heat resistance, light resistance, crack resistance, and mechanical strength and useful as electric/electronic materials and the like.

Means for Solving the Problem

Through the extensive investigations to solve the problem, the present inventors have noted the structure of a specific silicon-containing compound and its prepolymer and, as a result, completed the invention.

The invention provides a silicon-containing curing composition comprising (A) 100 parts by mass of a silicon-containing polymer having a weight average molecular weight of 300 to 100,000 obtained by hydrolysis and condensation of an organosilane mixture comprising (a) 5 to 50 mol % of one or more than one organosilane represented by general formula (1-1), (b) 0 to 50 mol % of one or more than one organosilane represented by general formula (1-2), (c) 0 to 40 mol % of one or more than one organosilane represented by general formula (1-3), (d) 0 to 50 mol % of one or more than one organosilane represented by general formula (1-4), and (e) 0 to 40 mol % of one or more than one organosilane represented by general formula (1-5), the sum of the organosilane (b) and the organosilane (c) being 5 to 60 mol %; (B) 0 to 200 parts by mass of a prepolymer containing at least two Si—H groups per molecule obtained by hydrosilylation between (α) at least one compound selected from a cyclic siloxane compound represented by general formula (2) and (β) at least one compound selected from a compound represented by general formula (3-1), a compound represented by formula (3-2), and a compound represented by general formula (3-3); (C) 0.1 to 30 parts by mass of a linear siloxane compound containing more than one carbon-carbon double bond reactive with an Si—H group or an Si—CH$_3$ group per molecule; (D) 0.0001 to 10 parts by mass of an organic peroxide and 0 to 1.0 part by mass of a metal catalyst; and (E) 0 to 1500 parts by mass of a filler.

[Chemical Formula 1]

$$R^1SiX_3 \quad (1\text{-}1)$$

$$R^2SiX_3 \quad (1\text{-}2)$$

$$R^3R^4SiX_2 \quad (1\text{-}3)$$

$$R^5SiX_3 \quad (1\text{-}4)$$

$$R^6SiX_3 \quad (1\text{-}5)$$

wherein $R^1$ represents an alkenyl group having 2 to 6 carbon atoms; $R^2$ represents a hydrogen atom or an alkyl group having 1 to 6 carbon atoms; $R^3$ and $R^4$ each independently represent a hydrogen atom or an alkyl group having 1 to 6 carbon atoms, an alkenyl group having 2 to 6 carbon atoms, or a phenyl group optionally substituted with an alkyl group having 1 to 6 carbon atoms; at least one of $R^2$, $R^3$, and $R^4$ is a methyl group; $R^5$ represents a phenyl group optionally substituted with an alkyl group having 1 to 6 carbon atoms; $R^6$ represents an epoxy group having 2 to 10 carbon atoms; and X represents a hydroxyl group, an alkoxy group having 1 to 6 carbon atoms, or a halogen atom.

[Chemical Formula 2]

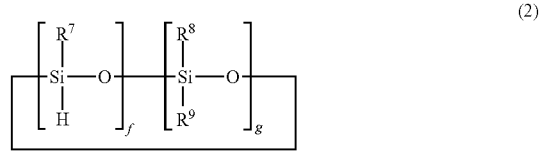

wherein R$^7$, R$^8$, and R$^9$ each independently represent an alkyl group having 1 to 6 carbon atoms or a phenyl group optionally substituted with an alkyl group having 1 to 6 carbon atoms; fR$^7$'s may be the same or different; gR$^8$'s may be the same or different; gR$^9$'s may be the same or different; f represents a number of 2 to 10; g represents a number of 0 to 8; and f+g≥2.

[Chemical Formula 3]

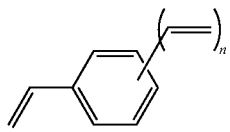

(3-1)

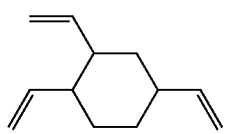

(3-2)

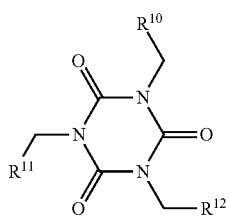

(3-3)

wherein R$^{10}$ represents an alkenyl group having 2 to 10 carbon atoms; R$^{11}$ and R$^{12}$ each independently represent an alkyl group having 1 to 10 carbon atoms, an alkenyl group having 2 to 10 carbon atoms, or an epoxy group having 2 to 10 carbon atoms; and n represents 1 or 2.

The invention also provides an embodiment of the silicon-containing curing composition, wherein the content of component (B) is 10 to 200 parts by mass per 100 parts by mass of component (A).

The invention also provides an embodiment of the silicon-containing curing composition, wherein component (C) is a linear siloxane compound represented by general formula (4):

[Chemical Formula 3]

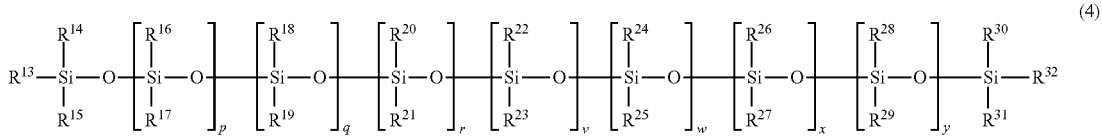

(4)

wherein R$^{13}$ and R$^{32}$ each independently represent an alkenyl group having 2 to 6 carbon atoms, an alkyl group having 1 to 6 carbon atoms, an epoxy group having 2 to 10 carbon atoms, or a trimethylsilyl group; R$^{14}$, R$^{15}$, R$^{16}$, R$^{17}$, R$^{21}$, R$^{25}$, R$^{29}$, R$^{30}$, and R$^{31}$ each independently represent a hydrogen atom or an alkyl group having 1 to 6 carbon atoms; R$^{18}$, R$^{19}$, and R$^{20}$ each represent a phenyl group; R$^{22}$, R$^{23}$, and R$^{24}$ each independently represent an alkenyl group having 2 to 6 carbon atoms; R$^{26}$, R$^{27}$, and R$^{28}$ each independently represent an epoxy group having 2 to 10 carbon atoms; when R$^{13}$ and R$^{32}$ each represent an alkyl group having 1 to 6 carbon atoms, v≥1 or v+w≥2; when at least one of R$^{14}$, R$^{16}$, R$^{17}$, R$^{21}$, R$^{25}$, R$^{29}$, R$^{30}$ and R$^{31}$ is a hydrogen atom, v≥1 or v+w≥2; when w≥1; pR$^{16}$'s may be the same or different; pR$^{17}$'s may be the same or different; qR$^{18}$'s may be the same or different; qR$^{19}$'s may be the same or different; rR$^{20}$'s may be the same or different; rR$^{21}$'s may be the same or different; vR$^{22}$'s may be the same or different; vR$^{23}$'s may be the same or different; wR$^{24}$'s may be the same or different; wR$^{25}$'s may be the same or different; xR$^{26}$'s may be the same or different; xR$^{27}$'s may be the same or different; yR$^{28}$'s may be the same or different; yR$^{29}$'s may be the same or different; p, q, r, v, w, x, and y each independently represent a number of from 0 to 3000; and p+q+r+v+w+x+y≥1.

The invention also provides a cured product obtained by curing the silicon-containing curing composition.

Effect of the Invention

The silicon-containing curing composition provided by the invention is capable of molding in a mold, such as transfer molding or injection molding to give a cured product excellent in heat resistance, crack resistance, and mechanical strength and useful as a semiconductor sealant, an LED sealant, a molding material for white LED packages, and the like. The silicon-containing curing composition of the invention also has good curability.

PREFERRED EMBODIMENTS FOR CARRYING OUT THE INVENTION

The silicon-containing curing composition of the invention and a cured product thereof will hereinafter be described in detail.

Component (A):

The silicon-containing polymer as component (A) will be described.

The silicon-containing polymer (A) has a weight average molecular weight (polystyrene equivalent molecular weight) of 300 to 100,000, preferably 800 to 50,000. If the weight average molecular weight of the silicon-containing polymer is smaller than 300, desired physical properties are not secured (reduction of weight loss temperature). If it is larger than 100,000, the polymer does not melt at a processing temperature in transfer molding or, if it does, shows low flowability (high viscosity) only to have reduced moldability.

The silicon-containing polymer (A) is obtained by hydrolysis and condensation of an organosilane mixture containing (a) 5 to 50 mol % of one or more than one organosilane represented by general formula (1-1), (b) 0 to 50 mol % of one or more than one organosilane represented by general formula (1-2), (c) 0 to 40 mol % of one or more than one organosilane represented by general formula (1-3), (d) 0 to 50 mol % of one or more than one organosilane represented by general formula (1-4), and (e) 0 to 40 mol % of one or more than one organosilane represented by general formula (1-5), provided that the sum of the organosilane (b) and the organosilane (c) is 5 to 60 mol %.

The organosilane (a) content in the organosilane mixture is preferably 10 to 40 mol % in terms of crosslinking density control during cure.

The organosilane mixture may not contain either one of organosilane (b) and organosilane (c) as long as the sum of these components is in the range of from 5 to 60 mol %. In view of crosslinking density control during cure, the content of the organosilane (b) is preferably 20 to 40 mol %. The content of the organosilane (c) is preferably 10 to 25 mol % in terms of flexibility of a cured product.

The content of the organosilane (d), which may or may not be present, is preferably in the range of from 5 to 45 mol % in terms of control on the melting temperature of the polymer. The content of the organosilane (e), which may or may not be present, is preferably 5 to 25 mol % in terms of adhesion to a different material.

The sum of the organosilane (b) content and the organosilane (c) content is preferably 25 to 55 mol % in terms of crosslinking density control during cure.

It is preferred that the organosilanes composing the organosilane mixture consist solely of the five organosilanes (a) through (e).

The silicon-containing polymer (A) is constructed from five units derived from the organosilanes (a) to (e), i.e., ($R^1SiO_{3/2}$), ($R^2SiO_{3/2}$), ($R^3R^4SiO$), ($R^5SiO_{3/2}$), and ($R^6SiO_{3/2}$), respectively, randomly linked to one another two- and three-dimensionally. Every unit is terminated by OH or X, X being a group derived from the organosilane (a), (b), (c), (d), or (e).

It should be understood that ($R^1SiO_{3/2}$) includes ($R^1SiX'O_{2/2}$); ($R^2SiO_{3/2}$) includes ($R^2SiX'O_{2/2}$); ($R^5SiO_{3/2}$) includes ($R^5SiX'O_{2/2}$); and ($R^6SiO_{3/2}$) includes ($R^6SiX'O_{2/2}$), wherein X' is the same as X in the organosilane (a), (b), (c), (d), or (e) or represents an OH group.

In general formula (1-1), examples of the C2-C6 alkenyl group represented by $R^1$ include vinyl, 2-propenyl, and 3-butenyl. A vinyl group is preferred for its reactivity.

In general formula (1-2), the C1-C6 alkyl represented by $R^2$ may be linear, branched, or cyclic. Examples thereof include methyl, ethyl, propyl, isopropyl, butyl, s-butyl, t-butyl, isobutyl, amyl, isoamyl, t-amyl, hexyl, and cyclohexyl. A methyl group is preferred as $R^2$ for its reactivity.

In general formula (1-3), examples of the C1-C6 alkyl represented by $R^3$ or $R^4$ and the C1-C6 alkyl substituting the phenyl group represented by $R^3$ or $R^4$ include those listed above for $R^2$. Examples of the C2-C6 alkenyl represented by $R^3$ or $R^4$ include those listed above for $R^1$. $R^3$ and $R^4$ are each preferably methyl or unsubstituted phenyl, more preferably methyl, in view of industrial availability.

In general formula (1-4), examples of the C1-C6 alkyl substituting the phenyl group represented by $R^5$ include those listed above for $R^2$. $R^5$ is preferably unsubstituted phenyl in view of industrial availability.

In general formula (1-5), the C2-C10 epoxy group represented by $R^6$ is a substituent having a three-membered cyclic ether, such as epoxyethyl, glycidyl, 2,3-epoxybutyl, 3,4-epoxybutyl, epoxyethylphenyl, 4-epoxyethylphenylethyl, 3,4-epoxycyclohexyl, 2-(3,4-epoxycyclohexyl)ethyl, or 2,3-epoxynorbornylethyl. $R^6$ is preferably glycidyl, 3,4-epoxycyclohexyl, or 2-(3,4-epoxycyclohexyl)ethyl in view of enhanced adhesion to different materials.

In general formulae (1-1) to (1-5), examples of the C1-C6 alkoxy represented by X include methoxy, ethoxy, propoxy, and butoxy, and examples of the halogen represented by X include chlorine, bromine, and iodine. X is preferably methoxy or ethoxy for reactivity. The X's in general formulae (1-1) through (1-5) may be the same or different.

When the five components are compounds in which X is C1-C6 alkoxy (i.e., alkoxysilanes), the hydrolysis and condensation reaction of the alkoxysilanes is effected by what we call a sol-gel reaction. For example, the sol-gel reaction is carried out with or without a solvent in the presence of a catalyst, such as an acid or a base. Suitable solvents include, but are not limited to, water, methanol, ethanol, n-propanol, isopropyl alcohol, n-butanol, isobutanol, t-butanol, acetone, methyl ethyl ketone, dioxane, tetrahydrofuran, and toluene. These solvents may be used either individually or as a mixture of two or more thereof.

The hydrolysis and condensation reaction of the alkoxysilanes proceeds in a manner such that the alkoxysilanes undergo hydrolysis with water to produce silanol groups (Si—OH), which are then condensed with themselves or with alkoxy groups. To allow the reaction to proceed, it is preferred to add an adequate amount of water to the reaction system. Water may be added to the solvent, or the catalyst may be added in the form of an aqueous solution. The hydrolysis and condensation reaction also proceeds in the presence of moisture in the air or a trace amount of water present in a solvent.

The catalyst used in the hydrolysis and condensation reaction, such as an acid or a base, is not particularly limited as long as it is capable of accelerating the reaction. Suitable catalysts include inorganic acids, such as hydrochloric acid, phosphoric acid, and sulfuric acid; organic acids, such as acetic acid, oxalic acid, p-toluenesulfonic acid, and monoisopropyl phosphate; inorganic bases, such as sodium hydroxide, potassium hydroxide, lithium hydroxide, and ammonia; amine compounds, such as trimethylamine, triethylamine, monoethanolamine, and diethanolamine; titanate esters, such as tetraisopropyl titanate and tetrabutyl titanate; carboxylic acid tin salts, such as dibutyltin laurate and tin octylate; boron compounds, such as trifluoroboron; chlorides and carboxylic acid salts (e.g., naththenate or octylate) of metals, such as iron, cobalt, manganese, and zinc; and aluminum compounds, such as aluminum triacetyl acetate. These catalysts may be used either individually or in combination thereof.

A preferred exemplary method for conducting the hydrolysis and condensation reaction of the alkoxysilanes is a polycondensation reaction under a basic condition (at a pH of 7 or higher) provided by the addition of a base catalyst. The hydrolysis and condensation reaction may also be carried out through hydrolysis and dehydration polycondensation in an acidic condition (at a pH of 7 or lower) provided by the addition of an acid catalyst.

It is preferred to stir the reaction system during the hydrolysis and condensation reaction. The reaction may be accelerated by heating the reaction system to 40° to 150° C.

The order of performing the hydrolysis and condensation reaction of the alkoxysilanes is not particularly limited. For example, an alkoxysilane having an alkenyl group ($R^1SiX_3$) is mixed with other alkoxysilanes ($R^2SiX_3$, $R^3R^4SiX_3$, $R^5SiX_3$, and $R^6SiX_3$), and the mixture is subjected to hydrolysis/condensation. Otherwise, one of the five organosilanes may be hydrolyzed and condensed to some extent, and other alkoxysilanes are added to the reaction system, followed by further continuing the hydrolysis/condensation reaction.

The five components (a) to (e) may comprise a combination of an organosilane wherein X is hydroxyl and an organosilane wherein X is alkoxy. In this case, the organosilane wherein X is hydroxyl is used without being hydrolyzed.

In using a halogenosilane (an organosilane wherein X is halogen), such as chlorosilane, it is hydrolyzed and condensed in the same manner as for the alkoxysilane.

After completion of the hydrolysis and condensation reaction, the reaction solvent, water, and the catalyst are removed from the reaction system to yield the produced silicon-containing polymer. This can be achieved by, for example, extracting the reaction system from an extracting solvent, such as toluene, and removing the extracting solvent by evaporation under reduced pressure in a nitrogen stream.

The resulting silicon-containing polymer may be modified for use as component (A). The method of modification is not particularly limited, and may include various modifications for converting a silicone resin to a reactive silicone resin. For example, amino-modification, epoxy-modification, carboxyl-modification, carbinol-modification, methacryl-modification, mercapto-modification, or phenol-modification may be carried out in a usual manner.

The silicon-containing polymer (A) preferably has a ratio of phenyl groups of 50 mass % or less, more preferably 40 mass % or less and a ratio of methyl groups of 85 mass % or less, more preferably 70 mass % or less, to the total organic components (components other than silicon). With a high phenyl group ratio, the silicon-containing polymer has a high melting point and hardly melts at a molding temperature and has difficulty in producing a cured product with an increased molecular weight in molding. It is preferred that the phenyl group ratio be low, and the methyl group ratio be high. It is more preferred that the phenyl to methyl group ratio be 50:30 to 80:30.

Component (A) may include one or more kinds of the above described silicon-containing polymers.

Component (B):

The prepolymer as component (B) will then be described.

The prepolymer (B) is effective in improving adhesion to metals, resins, etc. The prepolymer contains at least two Si—H groups per molecule and is obtained by hydrosilylation between at least one compound as component (α) and at least one compound as component (β). The silicon-containing curing composition of the invention contains component (B) in an amount of 0 to 200 parts by mass per 100 parts by mass of component (A). While the silicon-containing curing composition does not need to contain component (B), it is preferred for component (B) to be present in an amount of 10 to 200 parts by mass, more preferably 20 to 135 parts by mass, to produce the adhesion improving effect.

Component (α) comprises a cyclic siloxane compound having two or more Si—H groups per molecule represented by general formula (2). Examples of the C1-C6 alkyl group represented by $R^7$, $R^8$, or $R^9$ and the C1-C6 alkyl group that may substitute the phenyl group represented by $R^7$, $R^8$, or $R^9$ include those listed as $R^2$. From the standpoint of industrial availability, $R^7$ is preferably methyl, and $R^8$ and $R^9$ are each preferably methyl or phenyl. f is preferably 4 to 6 in terms of ease of preparation, and g is preferably 0 or 1 in terms of crosslinking density as a result of curing reaction. When the compound contains both methyl and phenyl, the methyl to phenyl group ratio in all the substituents $R^7$, $R^8$, and $R^9$ is preferably 4:1 to 1:4 in terms of molecular weight control.

Examples of component (α) include 1,3,5,7-tetramethylcyclotetrasiloxane, 1,3,5,7,9-pentamethylcyclopentasiloxane, and 1,3,5,7,9,11-hexamethylcyclohexasiloxane, with 1,3,5,7-tetramethylcyclotetrasiloxane being preferred in view of industrial availability and a suitable number of the Si—H functional groups. Component (α) may comprise one or more than one compound of general formula (2).

Component (β) comprises a compound of general formula (3-1), a compound of general formula (3-2), or a compound of general formula (3-3).

The compound of general formula (3-1) as component (β) is divinylbenzene with n being 1, which may be any of o-divinylbenzene, m-divinylbenzene, and p-divinylbenzene, or trivinylbenzene with n being 2, which may be any of 1,2,3-trivinylbenzene, 1,2,4-trivinylbenzene, and 1,3,5-trivinylbenzene. The compound of general formula (3-1) may have a functional group other than vinyl (e.g., methyl or a like alkyl group) bonded to the benzene ring. Component (β) may be a mixture of the compounds described.

In general formula (3-3) representing another compound as component (β), examples of the C2-C10 alkenyl represented by $R^{10}$, $R^{11}$, or $R^{12}$ include those listed for $R^1$ in general formula (1-1). Examples of the C1-C10 alkyl represented by $R^{11}$ or $R^{12}$ include those listed for $R^2$ in general formula (1-2) and, in addition, heptyl, octyl, nonyl, decyl, and ethylhexyl. The C2-C10 epoxy represented by $R^{11}$ or $R^{12}$ is an organic group having an epoxy group and includes those listed above for $R^6$ in general formula (1-5). A divinylbenzene is preferred as component (β) for its industrial availability.

Component (β) may comprise one or more than one of the compounds described.

The prepolymer as component (B) is obtained by hydrosilylation between component (α) and component (β). The component (α) to component (β) ratio is not particularly limited as long as the resulting prepolymer contains at least two Si—H groups per molecule. The ratio of the number (X) of the Si—H groups in component (α) to the number (Y) of the carbon-carbon double bonds in component (β) reactive with the Si—H groups, X:Y, is preferably 10:1 to 2:1, more preferably 4:1 to 2:1, in terms of the viscosity of the resulting prepolymer.

The Si—H group concentration in the prepolymer (B) is preferably 0.0001 to 100 mmol/g, more preferably 0.01 to 20 mmol/g, in terms of curability and storage stability.

The prepolymer (B) preferably has a weight average molecular weight of the 500 to 500,000. A more preferred molecular weight is 1000 to 300,000 in terms of heat resistance and handling. The weight average molecular weight of the prepolymer may be determined by GPC and calculated as a polystyrene equivalent value.

The hydrosilylation between components (α) and (β) is suitably carried out using a platinum group metal catalyst selected from catalysts containing at least one of platinum, palladium, and rhodium known to accelerate a hydrosilylation reaction. Suitable platinum group metal catalysts for hydrosilylation include platinum catalysts, such as a platinum-carbonylvinylmethyl complex, a platinum-divinyltetramethyldisiloxane complex, a platinum-cyclovinylmethylsiloxane complex, and a platinum-octylaldehyde complex; and compounds containing palladium, rhodium, or a like platinum group metal in place of platinum. These catalysts may be used either individually or in combination thereof. In view of curability, catalysts containing platinum are preferred, such as a platinum-divinyltetramethyldisiloxane complex (Karstedt's catalyst) and a platinum-carbonylvinylmethyl complex (Ossko catalyst). What we call Wilkinson catalyst containing the platinum group metal, such as chlorotris(triphenylphosphine) rhodium (I), is also included in the term "platinum group metal catalysts" as referred to herein.

The amount of the platinum group metal catalyst to be used is preferably 5 mass % or less, more preferably 0.0001 to 1.0 mass %, based on the sum of components (α) and (β) in terms of reactivity. The conditions of the hydrosilylation between components (α) and (β) are not particularly limited. The reaction can be conducted using the above described catalyst under conventional conditions. From the standpoint of curing rate, the reaction is preferably carried out at a temperature of from room temperature to 130° C. The reaction may be performed in a conventionally used solvent, such as toluene, xylene, hexane, methyl isobutyl ketone, cyclopentanone, or propylene glycol monomethyl ether acetate. The catalyst used may be removed after the hydrosilylation reaction or may remain in the resulting silicon-containing curing composition.

The prepolymer (B) is a prepolymer obtained by the hydrosilylation between component (α), which is a cyclic siloxane compound, and component (β), which is a compound of formula (3-1), (3-2), or (3-3). The invention is largely characterized in that the component (α) composing component (B) is a cyclic compound and that the component (α) is caused to react with component (β) into a prepolymer, which is compounded into the curing composition. Because component (α) composing component (B) has a cyclic structure, the silicon-containing curing composition of the invention has a small volume shrinkage on curing thereby to provide a cured product showing excellent adhesion. Furthermore, component (B) has a low viscosity and yet provides a high silicon content thereby to provide a curing composition excellent in heat resistance and adhesion.

Component (C):

Component (C) is then described.

Component (C) is a linear siloxane copolymer containing at least two carbon-carbon double bonds reactive with Si—H or Si—CH$_3$ per molecule. The linear siloxane copolymer may be either a random copolymer or a block copolymer. The number of the carbon-carbon double bonds reactive with Si—H or Si—CH$_3$ is preferably 2 to 10 and, in terms of crosslinking density of a cured product, more preferably 2 to 6. The carbon-carbon double bond reactive with Si—H or Si—CH$_3$ may be an alkenyl group, e.g., vinyl, 2-propenyl, or 3-butenyl. A vinyl group bonded to a silicon atom (Si—CH=CH$_2$) is particularly preferred in terms of reactivity.

Taking the physical properties of a cured product into consideration, component (C) is preferably a linear siloxane copolymer represented by general formula (4) shown supra.

In general formula (4), examples of the C2-C6 alkenyl group represented by $R^{13}$, $R^{32}$, $R^{22}$, $R^{23}$, or $R^{24}$ include those enumerated above for $R^1$. Examples of the C1-C6 alkyl group represented by $R^{13}$, $R^{32}$, $R^{14}$, $R^{15}$, $R^{16}$, $R^{17}$, $R^{21}$, $R^{25}$, $R^{29}$, $R^{30}$, or $R^{31}$ include those listed for $R^2$. Examples of the C2-C10 epoxy group represented by $R^{13}$, $R^{32}$, $R^{26}$, $R^{27}$, or $R^{28}$ include those listed for $R^6$.

In general formula (4), $R^{13}$ and $R^{32}$ are each preferably vinyl or 2-propenyl in terms of reactivity; $R^{14}$, $R^{15}$, $R^{16}$, $R^{17}$, $R^{21}$, $R^{25}$, $R^{29}$, $R^{30}$, and $R^{31}$ are each preferably methyl or ethyl in terms of industrial availability; and $R^{22}$, $R^{23}$, and $R^{24}$ are each preferably vinyl or 2-propenyl in terms of industrial availability. Examples of preferred linear siloxane compounds (C) include compounds represented by general formulae (5) through (14) below:

[Chemical Formula 5]

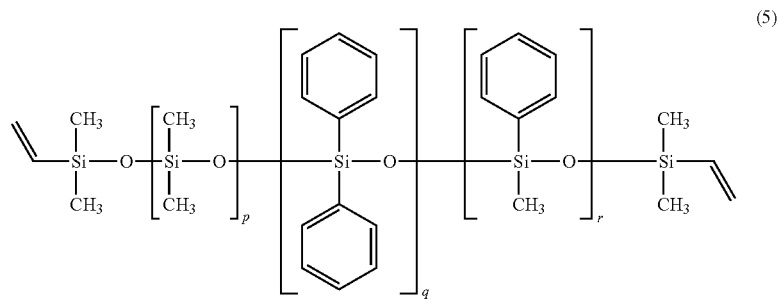

(5)

wherein p, q and r are the same groups as p, q and r in the above-mentioned general formula (4).

[Chemical Formula 6]

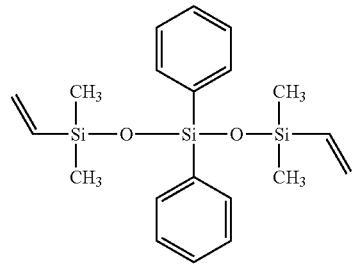

(6)

[Chemical Formula 7]

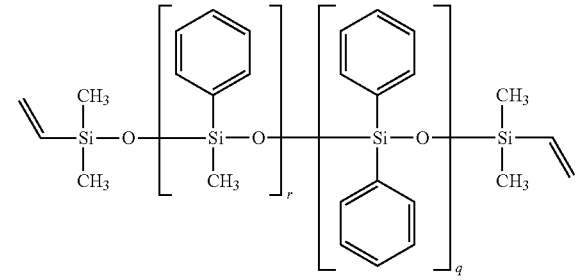

(7)

wherein r and q are the same groups as r and q in the above-mentioned general formula (4).

[Chemical Formula 8]

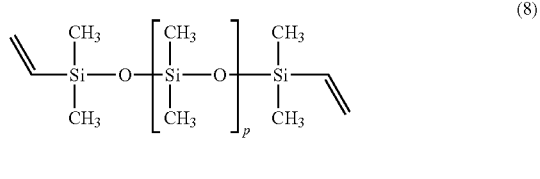
(8)

wherein p is the same groups as p in the above-mentioned general formula (4).

[Chemical Formula 9]

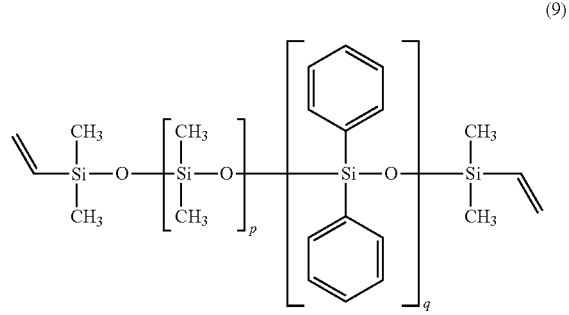
(9)

wherein p and q are the same groups as p and q in the above-mentioned general formula (4).

[Chemical Formula 10]

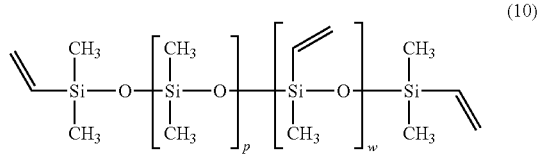
(10)

wherein p and w are the same groups as p and w in the above-mentioned general formula (4).

[Chemical Formula 11]

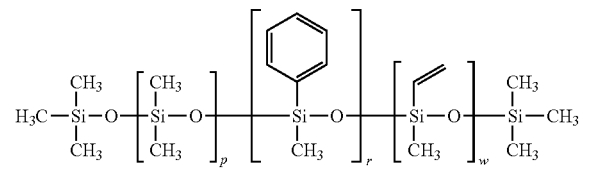
(11)

wherein p, r and w are the same groups as p, r and w in the above-mentioned general formula (4).

[Chemical Formula 12]

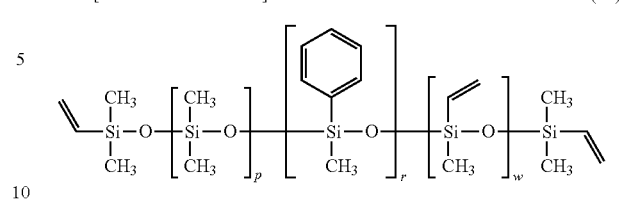
(12)

wherein p, r and w are the same groups as p, r and w in the above-mentioned general formula (4).

[Chemical Formula 13]

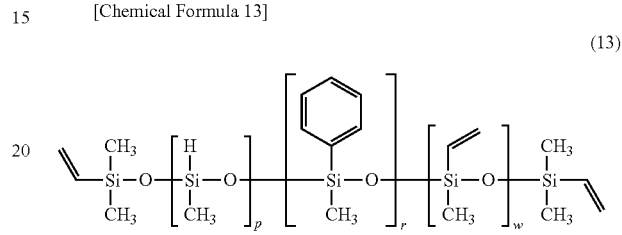
(13)

wherein p, r and w are the same groups as p, r and w in the above-mentioned general formula (4).

[Chemical Formula 14]

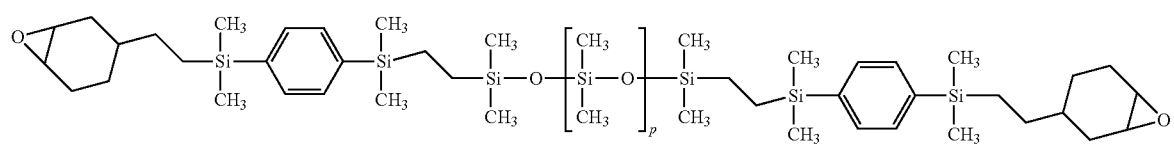
(14)

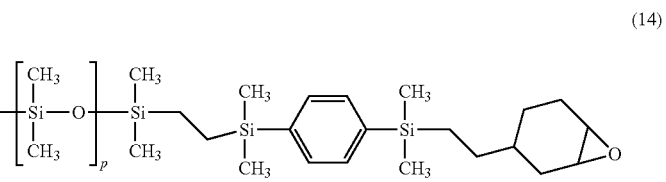

wherein p is the same groups as p in the above-mentioned general formula (4).

Component (C) is a linear siloxane compound having at least two carbon-carbon double bonds reactive with Si—H or Si—CH$_3$ per molecule. Because of being a linear siloxane compound, component (C) brings about improvement in adhesion. The silicon-containing curing composition of the invention contains the linear siloxane copolymer (C) in an amount of 0.1 to 30 parts by mass per 100 parts by mass of component (A). The content of component (C) is preferably 0.1 to 25 parts by mass, more preferably 3 to 20 parts by mass, from the viewpoint of adhesion improvement.

The content of component (A) in the silicon-containing curing composition of the invention is preferably 5 to 90 mass %, more preferably 5 to 80 mass %. The sum of components (B) and (C) is preferably 0.05 to 50 mass %, more preferably 5 to 40 mass %.

The contents of components (B) and (C) are decided as appropriate taking into consideration the Si—H to Si—H-reactive carbon-carbon double bond ratio or the Si—CH$_3$ to Si—CH$_3$-reactive carbon-carbon double bond ratio. The Si—H (in component (B)) to Si—H-reactive carbon-carbon double bond (in component (C)) equivalent ratio is preferably 0.1 to 10, more preferably 1.0 to 5.0. The Si—CH$_3$ (in component (B)) to Si—CH$_3$-reactive carbon-carbon double bond (in component (C)) equivalent ratio is preferably 0.1 to 10, more preferably 1.0 to 5.0.

Component (D):

The organic peroxide as component (D), which serves as a cure accelerator, will be described.

Component (D) acts as a catalyst that activates the methyl group bonded to Si (Si—CH$_3$) in component (A) and also the methyl group bonded to Si if there is any in component (B) and/or component (C) thereby to induce polymerization between the Si—CH$_3$ groups and the alkenyl groups in component (A) and also with the carbon-carbon double bonds in component (C). The organic peroxide as component (D) is not particularly limited and may be any of those commonly used in curing silicone rubber compositions. Suitable organic peroxides (D) include benzoyl peroxide, o-methylbenzoyl peroxide, p-methylbenzoyl peroxide, o-monochlorobenzoyl peroxide, p-monochlorobenzoyl peroxide, bis(2,4-dichlorobenzoyl) peroxide, 2,4-dicumylbenzoyl peroxide, di(t-butylbenzoyl) peroxide, t-butyl benzoate, t-butylcumylbenzoyl peroxide, 1,1-bis(t-butylperoxy)-3,3,5-trimethylcyclohexane, 2,5-dimethyl-2,5-di(t-butylperoxy) hexane, 1,6-bis(t-butyl peroxycarboxy)hexane, dicumyl peroxide, dimyristyl peroxycarbonate, t-butylperoxy 2-ethylhexylcarbonate, dicyclododecylperoxy dicarbonate, and compounds represented by general formula (15) or (15') below. Preferred of them are benzoyl peroxide compounds, particularly benzoyl peroxide and 2,4-dicumylbenzoyl peroxide, from the standpoint of reactivity and workability.

[Chemical Formula 15]

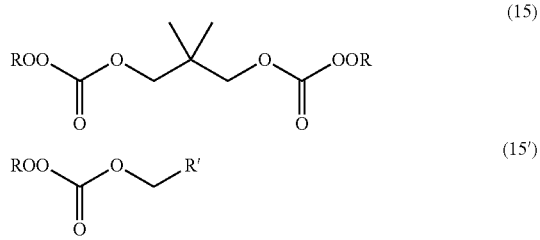

(15)

(15')

wherein R and R' each independently represent a hydrocarbon group having 3 to 10 carbon atoms, Examples of the C3-C10 hydrocarbon group represented by R in general formulae (15) and (15') and R' in general formula (15') include alkyl groups, such as propyl, isopropyl, butyl, sec-butyl, tert-butyl, isobutyl, amyl, isoamyl, tert-amyl, hexyl, cyclohexyl, cyclohexylmethyl, 2-cyclohexylethyl, heptyl, isoheptyl, tert-heptyl, n-octyl, isooctyl, tert-octyl, 2-ethylhexyl, nonyl, isononyl, and decyl; alkenyl groups, such as vinyl, 1-methylethenyl, 2-methylethenyl, propenyl, butenyl, isobutenyl, pentenyl, hexenyl, heptenyl, octenyl, decenyl, and 1-phenylpropen-3-yl; phenyl; alkylaryl groups, such as 2-methylphenyl, 3-methylphenyl, 4-methylphenyl, 4-vinylphenyl, 3-isopropylphenyl, 4-isopropylphenyl, 4-butylphenyl, 4-isobutylphenyl, 4-tert-butylphenyl, 2,3-dimethylphenyl, 2,4-dimethylphenyl, 2,5-dimethylphenyl, 2,6-dimethylphenyl, 3,4-dimethylphenyl, 3,5-dimethylphenyl, and 2,4-di-tert-butylphenyl; arylalkyl groups, such as benzyl, 2-phenylporpan-2-yl, styryl, and cinnamyl; and these hydrocarbon groups interrupted by an ether bond or a thioether bond, such as 2-methoxyethyl, 3-methoxypropyl, 4-methoxybutyl, 2-butoxyethyl, methoxyethoxyethyl, methoxyethoxyethoxyethyl, 3-methoxybutyl, 2-phenoxyethyl, 3-phenoxypropyl, 2-methylthioethyl, and 2-phenylthioethyl. These groups can optionally be substituted by an alkoxy group, an alkenyl group, a nitro group, a cyano group, a halogen atom, and so on.

The content of the organic peroxide (D) in the silicon-containing curing composition of the invention is 0.0001 to 10 parts by mass, preferably 0.01 to 5 parts by mass, per 100 parts by mass of the silicon-containing polymer (A).

The metal catalyst as component (D) will then be described. The metal catalyst (D) is exemplified by the platinum group metal catalysts described above as a catalyst catalyzing the hydrosilylation of components ($\alpha$) and ($\beta$) in the preparation of the prepolymer (B). The platinum group metal catalyst that has been used in the hydrosilylation reaction between components ($\alpha$) and ($\beta$) and remains in the resulting prepolymer (B) may be made use of as component (D). Also included in the metal catalysts (D) are Al-, Ti-, or Sn-based catalysts, such as tris(2,4-pentanedionato)aluminum, Al(acac)$_3$, Al(ClO$_4$)$_3$, Ti(O-i-Pr)$_4$, Ti(O-i-Bu)$_4$, Bu$_2$Sn (acac)$_2$, and Bu$_2$Sn(C$_7$H$_{15}$COO)$_2$.

Preferred of them are platinum group metal catalysts and Al-based catalysts in terms of reactivity and colorability, particularly a platinum-carbonylvinylmethyl complex (Ossko catalyst), a platinum-divinyltetradimethyldisiloxane complex (Karstedt's complex), tris(2,4-pentanedionato)aluminum, and Al(acac)$_3$.

The metal catalyst (D) is effective in acceleration of hydrosilylation and dehydration condensation of silanol groups. The content of the metal catalyst (D) in the silicon-containing curing composition of the invention is 0 to 1.0 part by mass per 100 parts by mass of the silicon-containing polymer (A). While the composition does not need to contain component (D), the composition preferably contains component (D) in an amount of $1 \times 10^{-4}$ to 0.5 parts by mass, more preferably $1 \times 10^{-3}$ to 0.2 parts by mass, in terms of the above described effects.

From the viewpoint of curability and storage stability, the content of component (D), i.e., the sum of the organic peroxide and the metal catalyst, in the silicon-containing curing composition of the invention is preferably 5 mass % or less, more preferably 0.0001 to 3.0 mass %. When the content of component (D) is less than 0.0001 mass %, the effect of sufficiently accelerating the reaction of the silicon-containing curing composition is not obtained. Even if the content exceeds 5 mass %, no further effects will be produced.

Component (E):

The filler as component (E) will be described.

Incorporating the filler into the silicon-containing curing composition results in the production of a cured product in a desired color. Additionally, the silicon-containing curing composition containing the filler produces a cured product with enhanced hardness. Suitable fillers include transparent fillers, white pigments, and inorganic fillers.

The white pigment serves as a white colorant that can provide an increase degree of whiteness. Suitable white pigments include titanium dioxide, which may be of any of rutile, anatase, and brookite types but is preferably rutile titanium dioxide in view of light resistance. While the titanium dioxide filler is not limited in average particle size and shape, the average particle size is usually 0.05 to 5.0 µm. Titanium dioxide may be surface-treated with a water-containing oxide of Al, Si, etc. so as to increase the compatibility or dispersibility with a resin or an inorganic filler.

The average particle size can be obtained as a mass average value $D_{50}$ (or median diameter) by laser diffraction scattering particle size distribution measurement.

Also included in useful white pigments are potassium titanate, zirconium oxide, zinc sulfide, alumina, zinc oxide, magnesium oxide, and beryllium oxide. Among them, magnesium oxide and zinc oxide are preferred because they are able to retain the reflectance at low wavelengths (300 to 400 nm). These white pigments may be used either alone or in combination with titanium dioxide.

The inorganic filler to be used may be chosen from those commonly used in sealing materials, such as silicone resin compositions and epoxy resin compositions. Suitable inorganic fillers include silica fillers, such as fused silica, fused spherical silica, crystalline silica, colloidal silica, fumed silica, and silica gel; metal oxides, such as alumina, iron oxide, titanium oxide, and antimony trioxide; ceramics, such as silicon nitride, aluminum nitride, boron nitride, and silicon carbide; minerals, such as mica and montmorillonite; metal hydroxides, such as aluminum hydroxide and magnesium hydroxide, which may optionally be modified by an organic modification treatment; metal carbonates, such as calcium carbonate, calcium silicate, magnesium carbonate, and barium carbonate, which may optionally be modified by an organic modification treatment; pigments, such as metal borates and carbon black; carbon fiber, graphite, whisker, kaolin, talc, glass fiber, glass beads, glass microspheres, silica glass, layered clay minerals, clay, silicon carbide, quartz, aluminum, and zinc. Organic fillers, such as acrylic beads, polymer particles, transparent resin beads, wood meal, pulp, and cotton fiber, are also usable as filler (E).

While the organic or inorganic fillers are not particularly limited in average particle size and shape, the average particle size is usually 0.1 to 80 μm. The average particle size can be obtained as a mass average value $D_{50}$ (or median diameter) by laser diffraction scattering particle size distribution measurement.

Preferred of the inorganic fillers described above are silica fillers, metal oxides, optionally modified metal carbonates, and pigments in view of resin moldability and strength. More preferred are fused silica, fused spherical silica, crystalline silica, silicone beads, colloidal silica, aluminum oxide, titanium oxide, calcium carbonate, magnesium carbonate, carbon black, kaolin, and glass fiber.

Especially preferred inorganic fillers are fused silica, fused spherical silica, and a titanium oxide-calcium carbonate composite in view of resin moldability. The average particle size of the inorganic filler is preferably, but not limited to, 4 to 40 μm, more preferably 7 to 35 μm in terms of moldability and flowability. To obtain high flowability, it is desirable to use a combination of fine particles of 3 μm or smaller, medium particles of 4 to 8 μm, and coarse particles of 10 to 40 μm.

The inorganic filler may be surface treated with a coupling agent, such as a silane coupling agent or a titanate coupling agent, to increase adhesion to metal.

Suitable coupling agents include alkyl-functional alkoxysilanes, such as dimethyldimethoxysilane, dimethyldiethoxysilane, methylethyldimethoxysilane, methylethyldiethoxysilane, methyltrimethoxysilane, methyltriethoxysilane, ethyltrimethoxysilane, and ethyltrimethoxysilane; alkenyl-functional alkoxysilanes, such as vinyltrichlorosilane, vinyltrimethoxysilane, vinyltriethoxysilane, and allyltrimethoxysilane; epoxy-functional alkoxysilanes, such as 3-methacryloxypropyltriethoxysilane, 3-methacryloxypropyltrimethoxysilane, 3-methacryloxypropylmethyldiethoxysilane, 3-methacryloxypropylmethyldimethoxysilane, 2-methacryloxypropyltrimethoxysilane, γ-glycidoxypropyltrimethoxysilane, γ-glycidoxypropylmethyldiethoxysilane, and 13-(3,4-epoxycyclohexyl)ethyltrimethoxysilane; amino-functional alkoxysilanes, such as N-β(aminoethyl)-γ-aminopropyltrimethoxysilane, γ-aminopropyltriethoxysilane, and N-phenyl-γ-aminopropyltrimethoxysilane; mercapto-functional alkoxysilanes, such as γ-mercaptopropyltrimethoxysilane; titanium alkoxides, such as titanium tetraisopropoxide and titanium tetra-n-butoxide; titanium chelates, such as titanium dioctyloxybis(octylene glycolate) and titanium diisopropoxybis(ethylacetoacetate); zirconium chelates, such as zirconium tetraacetylacetonate and zirconium tributoxymonoacetylacetonate; zirconium acylates, such as zirconium tributoxymonostearate; and isocyanate silanes, such as methyltriisocyanate silane. The amount of the coupling agent and the method for surface treatment are not particularly limited.

The total content of the filler (E) in the silicon-containing curing composition of the invention is 0 to 1500 parts by mass per 100 parts by mass of the silicon-containing polymer (A). While the filler (E) does not need to be contained, it is preferably present in an amount of 10 to 1500 parts by mass, more preferably 100 to 1400 parts by mass, even more preferably 300 to 1350 parts by mass, in terms of the above described effects.

A combined use of the white pigment and the inorganic filler is also preferred for the silicon-containing curing composition.

The silicon-containing curing composition of the invention may further contain a cyclic siloxane compound to have improved adhesion.

The cyclic siloxane compound is exemplified by a cyclic siloxane copolymer containing at least two carbon-carbon double bonds reactive with Si—H per molecule. The cyclic siloxane copolymer may be either a random copolymer or a block copolymer. The number of the carbon-carbon double bonds reactive with Si—H is preferably 2 to 10 and, in terms of crosslinking density of a cured product, more preferably 2 to 6. The carbon-carbon double bond reactive with Si—H may be an alkenyl group, e.g., vinyl. A vinyl group bonded to a silicon atom (Si—CH=CH$_2$) is particularly preferred in terms of reactivity.

Taking the physical properties of a cured product into consideration, the cyclic siloxane compound is preferably a cyclic siloxane copolymer represented by general formula (16):

[Chemical Formula 16]

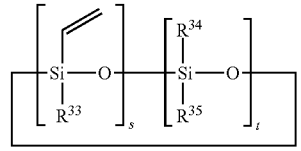

(16)

wherein $R^{33}$, $R^{34}$, and $R^{35}$ each independently represent an alkyl group having 1 to 6 carbon atoms or a phenyl group optionally substituted with an alkyl group having 1 to 6 carbon atoms; s$R^{33}$'s may be the same or different; t$R^{34}$'s may be the same or different; t$R^{35}$'s may be the same or different; s is a number of 2 to 10; t is a number of 0 to 8; and s+t≥2.

In general formula (16), examples of the C1-C6 alkyl group represented by $R^{33}$, $R^{34}$, or $R^{35}$ and the C1-C6 alkyl group that may substitute the phenyl group represented by $R^{33}$, $R^{34}$, or $R^{35}$ include those listed above for $R^2$.

From the standpoint of industrial availability, $R^{33}$, $R^{34}$, and $R^{35}$ in general formula (16) are each preferably methyl or phenyl. s is preferably 2 to 4 in terms of crosslinking density, and t is preferably 1 to 3 in terms of viscosity.

Examples of preferred cyclic siloxane compounds include those represented by formulae (17) to (19):

[Chemical Formula 17]

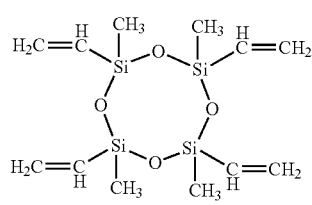

(17)

[Chemical Formula 18]

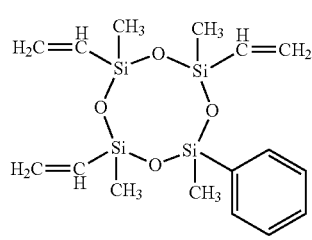

(18)

[Chemical Formula 19]

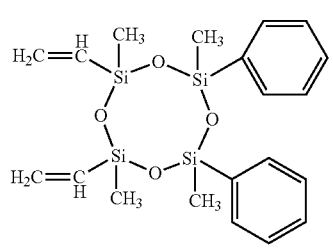

(19)

The silicon-containing curing composition of the invention may further contain a compound having a cyanuric acid structure as an adhesion assistant to have improved adhesion (or contact). Examples of the compound having a cyanuric acid structure include isocyanuric acid, triallylcyanuric acid, 1,3,5-triglycidylisocyanuric acid, tris(2-hydroxyethyl)isocyanuric acid, tris(2,3-dihydroxypropyl)isocyanuric acid, tris(2,3-epoxypropyl)isocyanuric acid, and the compounds described in JP 2768426, JP 3-261769A, JP 4-139211A, JP 4-139174A, and JP 10-333330A. These compounds may be subjected to various modification treatments in a usual manner, such as silicone modification, ethylene oxide modification, and propylene oxide modification. In using the compound with a cyanuric acid structure, a suitable content of the compound in the silicon-containing curing composition is 0.0001 to 10 mass %, more preferably 0.01 to 1.0 mass %.

The silicon-containing curing composition of the invention may optionally contain a free radical scavenger. Substances having antioxidative property including antioxidants and stabilizers may be used as a free radical scavenger. Suitable free radical scavengers include triethylene glycol bis[3-(3-t-butyl-5-methyl-4-hydroxyphenyl)propionate], dibutylhydroxytoluene, and 2,6-di-t-butyl-p-cresol. The content of the free radical scavenger in the silicon-containing curing composition is preferably 0.1 to 50 mass %, more preferably 1 to 30 mass %, in terms of heat resistance, electrical characteristics, curability, mechanical characteristics, storage stability, and handling.

The silicon-containing curing composition of the invention may further optionally contain a coupling agent. Addition of a coupling agent brings about improvement of adhesion. Examples of useful coupling agents include those described supra as a surface treating agent for the inorganic filler and a compound represented by formula (20) below. Preferred of them are silane coupling agents, such as epoxy-functional alkoxysilanes, amino-functional alkoxysilanes, and mercapto-functional alkoxysilanes. In particular, γ-glycidoxypropyltrimethoxysilane, N-phenylmaminopropyltrimethoxysilane, N-phenyl-γ-aminoethyltrimethoxysilane, and γ-mercaptopropyltrimethoxysilane are more preferred. The content of the coupling agent in the silicon-containing curing composition is preferably 0.1 to 0.5 mass %, more preferably 0.2 to 0.3 mass %.

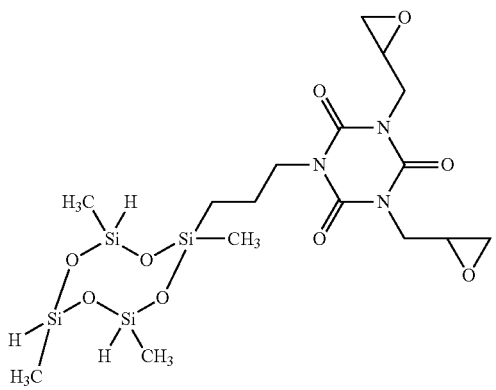

(20)

If desired, the silicon-containing curing composition of the invention may contain other optional components in addition to the above described adhesion assistant, free radical scavenger, and coupling agent, such as various known resins, release agents, and additives, in amounts that do not adversely affect the intended performance of the silicon-containing curing composition of the invention. The amount of the optional components other than the adhesion assistant, free radical scavenger, and coupling agent is not particularly limited but is preferably within 5 mass % relative to the silicon-containing curing composition so as not to impair the effects of the invention.

The silicon-containing curing composition of the invention may be additionally functionalized by bonding an organic functional group of various kinds to any one or more of components (A) to (E). The silicon-containing curing composition of the invention or a cured product thereof may be used as a matrix in which a useful compound is dispersed to give a highly functionalized composite material.

Examples of various resins that may be optionally compounded include polybutadiene resins and modified products thereof, modified acrylonitrile copolymers, polystyrene resins, polyethylene resins, fluororesins, polyimide resins, polyether resins, such as polyethylene glycol, polyphenylene ether, and polypropylene glycol, polyurethane resins, epoxy resins, phenol resins, polyester resins, melamine resins, polyamide resins, polyphenylene sulfide resins. Examples of additives that may be optionally compounded include gloss agents, waxes, UV absorbers, antistatics, antioxidants, deterioration inhibitors, modifiers, silane coupling agents, defoaming agents, dyes, maleimide compounds, cyanate ester compounds, silicone gel, and silicone oil.

Useful release agents include carnauba wax, fatty acid esters, glyceric esters, stearic acid, montanoic acid, behenic acid and its metal salts, alkali metal compounds, organotitanium compounds, organozirconia compounds, organotin compounds, imidazole compounds, carboxyl-containing polyolefins, polyethylene-polyoxyethylene resins, and carnauba.

The silicon-containing curing composition of the invention is solid at room temperature (25° C.) and therefore has good handling. The silicon-containing curing composition may have any of powdered, granular, and tablet forms and may be used as dissolved in a solvent. The silicon-containing curing composition preferably has a melting temperature of 50° to 150° C., more preferably 50° to 120° C. The silicon-containing curing composition preferably melts at 50° to 150° C. and then cures on heating.

A cured product of the silicon-containing curing composition of the invention is excellent particularly in heat resistance and adhesion. With respect to heat resistance, the silicon-containing curing composition gives to advantage a cured product preferably having a 5 mass % weight loss temperature of 400° C. or higher, more preferably 500° C. or higher. The silicon-containing curing composition produces to advantage a cured product with reduced cracking.

The silicon-containing curing composition of the invention shows a rapid curing rate through the polycondensation reaction between the Si—CH$_3$ groups and the carbon-carbon double bonds (e.g., Si—CH=CH$_2$) present in whichever of components (A), (B), and (C) by the effect of the organic peroxide (D). Because the silicon-containing curing composition of the invention is uniform and transparent, it well transmits light, such as UV light, so that it may be made photocurable by addition of a photoreactive catalyst. The composition may also be made photocurable by compounding with a photoreactive monomer or resin or by using a component having a photocurable group incorporated therein as any one or more of the components composing the silicon-containing curing composition. The silicon-containing curing composition of the invention also provides materials excellent in mechanical, optical, and electrical characteristics, such as weatherability, hardness, resistance to staining, flame retardance, moisture resistance, gas barrier properties, flexibility, elongation and strength, electrical insulating properties, and low dielectric constant.

The cured product according to the invention will then be described.

The silicon-containing curing composition of the invention cures on heating to provide a cured product. The cure reaction may be performed in any manner. For example, all the components making up the silicon-containing curing composition may be mixed up immediately before use or may previously be compounded to prepare the composition, which is heated or otherwise cured on demand.

The heating temperature for cure is preferably at or above the temperature at which the resin melts, i.e., 35° to 350° C., more preferably 50° to 250° C. The cure time is preferably 2 to 60 minutes, more preferably 2 to 10 minutes. Where necessary, the cured product may be annealed or formed afterward. The annealing time varies with temperature. At an annealing temperature of 150° C., for example, the annealing time is preferably 5 to 60 minutes. On curing under the conditions described above, the silicon-containing curing composition of the invention provides a cured product excellent in heat resistance, durability, adhesion, and the like. The molding may be conducted in known methods, such as transfer molding, compression molding, and casting. Transfer molding is preferred in term of workability and dimensional stability.

Transfer molding is preferably achieved using a transfer molding apparatus under a molding pressure of 5 to 20 N/mm$^2$, at a molding temperature of 120° to 190° C., for 30 to 500 seconds, more preferably at 150° to 185° C. for 30 to 180 seconds. Compression molding is preferably performed using a compression molding apparatus at a molding temperature of 120° to 190° C. for 30 to 600 seconds, more preferably at 130° to 160° C. for 120 to 300 seconds. Whichever molding process is employed, the curing reaction is achieved at a temperature of 150° to 185° C. for a period of 2 to 20 hours.

The silicon-containing curing composition of the invention can be made use of as a curable composition providing, on cure, a cured product having excellent physical properties, such as heat resistance, light resistance, crack resistance, and colorability. The silicon-containing curing composition and its cured product are useful as materials in the electrical/electronic material field, including display, optical, and recording materials and sealing materials for printed circuit boards, semiconductors, and solar cells; high voltage insulating material; and a variety of materials for electrical insulation, vibration insulation, water-proofing, and moisture-proofing. The silicon-containing curing composition may also be cured using an appropriate film formation technique, such as spin casting, potting, or dipping. Applications of the silicon-containing curing composition and its cured product include prototype matrices for plastic parts, coating materials, interlayer dielectric films, prepregs, insulating packing, heat shrinkable rubber tubes, O-rings, sealants and protectors for display devices, optical waveguides, optical fiber protectors, optical lenses, adhesives for optical equipment, highly heat resistant adhesives, elastic adhesives, pressure sensitive adhesives, die bonding agents, reflectors for LEDs (by transfer molding, compression molding, or casting), package (surface-mounted or molded) and lead frame substrates, substrates for surface-mounted LEDs, highly heat dissipation materials, highly heat resistant sealants, parts of solar cells and fuel cells, solid electrolytes for batteries, insulating coatings, photoreceptor drums for copiers, and gas separation membranes. They are also applicable to the field of civil engineering and construction as concrete protective materials, liners, soil injection agents, sealants, cold thermal storage materials, glass coatings, foamed materials, and coatings; and to the field of medical materials as tubes, sealants, coatings, parts of printed circuit boards, sealants for disinfection devices, contact lenses, and oxygen-rich membranes. They are also applicable to films, gaskets, casting materials, various molding materials, anti-corrosion and waterproofing sealants for wire-glass, automotive parts, and various machine parts.

EXAMPLES

The invention will further be illustrated with reference to examples, but it should be understood that the invention is not limited thereto. In examples, all the parts and percents are by mass.

Synthesis Example 1

Synthesis of Silicon-Containing Polymer A-1 as Component (A)

In a 2000 ml four-necked flask equipped with a condenser tube and a stirrer were put 0.5 mol of vinyltrimethoxysilane as component (a), 0.5 mol of methyltrimethoxysilane as component (b), 0.25 mol of dimethyldimethoxysilane as component (c), 1.0 mol of phenyltrimethoxysilane as component (d), and 650 g of toluene. To the mixture was added dropwise 31.4 g of a 0.5% sodium hydroxide aqueous solution over a period of 30 minutes while stirring, to cause dehydration polymerization at 60° to 65° C. for 3 hours. The reaction mixture was cooled to room temperature, and 600 g of toluene and 1500 g of ion exchanged water were added to extract the oily phase, which was washed with water until the washing became neutral. The solvent was removed to give 232.6 g of silicon-containing polymer A-1 as white powder (component A). Silicon-containing polymer A-1 was analyzed by GPC under the following conditions and found to have a polystyrene equivalent weight average molecular weight (hereinafter "Mw") of 15000.
GPC conditions:
Column: SuperMultipore HZ-M
Developing solvent: tetrahydrofuran Synthesis Example 2

Synthesis of Silicon-Containing Polymer A-2 as Component (A)

In a 1000 ml four-necked flask equipped with a condenser tube and a stirrer were put 0.139 mol of vinyltrimethoxysilane as component (a), 0.278 mol of methyltriethoxysilane as component (b), 0.056 mol of dimethyldimethoxysilane and 0.034 mol of diphenylsilanediol as component (c), 0.05 mol of phenyltrimethoxysilane as component (d), and 280 g of methyl ethyl ketone. To the mixture was added dropwise 30 g of a 0.1% oxalic acid aqueous solution while stirring, followed by stirring at room temperature for 1 hour. To the reaction system was added dropwise 40 g of a 0.1% sodium hydroxide aqueous solution while stirring to cause dehydration polymerization under reflux for 10 hours. The reaction mixture was cooled to room temperature, and 50 g of ion exchanged water was added to extract the oily phase, which was washed with water until the washing became neutral. The solvent was removed to give 52 g of silicon-containing polymer A-2 as white powder (component (A)). Silicon-containing polymer A-2 was analyzed by GPC under the conditions described supra and found to have an Mw of 20000.

Synthesis Example 3

Synthesis of Prepolymer B-1 as Component (B)

A hundred parts of 1,3,5,7-tetramethylcyclotetrasiloxane, 100 parts of divinylbenzene, 60 parts of toluene, and 0.0005 parts of a platinum-carbonylvinylmethyl complex (Ossko catalyst) were mixed and refluxed for 5 hours while stirring. The solvent was removed by evaporation under reduced pressure at 70° C. to yield prepolymer B-1 as component (B).
Prepolymer B-1 was found to have an Mw of 140,000 as a result of GPC under the conditions described supra and a hydrosilyl group (Si—H) content of 5.3 mmol/g as a result of $^1$H-NMR.

Synthesis Example 4

Synthesis of Linear Siloxane Compound C-1 as Component (C)

Thirty parts of dichlorodiphenylsilane was dissolved in 450 parts of methyl isobutyl ketone, and 60 parts of dimethylvinylchlorosilane was added dropwise to the solution. After the addition, the mixture was allowed to react at room temperature for 2 hours. The solvent was removed to give linear siloxane compound C-1 represented by formula (6) as component (C).

Synthesis Example 5

Synthesis of Linear Siloxane Compound C-2 as Component (C)

A hundred parts of dichlorodimethylsilane was added dropwise to a mixture of 100 parts of ion exchanged water, 50 parts of toluene, and 450 parts of a 48% sodium hydroxide aqueous solution and allowed to polymerize at 105° C. for 5 hours. The resulting reaction solution was washed with 500 parts of ion exchanged water. The toluene solution was dehydrated, 20 parts of pyridine was added thereto, and 20 parts of dimethylvinylchlorosilane was further added, followed by stirring at 70° C. for 30 minutes. The reaction system was washed with 100 parts of ion exchanged water, and the solvent was removed by evaporation under reduced pressure at 150° C. The residue was washed with 100 parts of acetonitrile, and the solvent was removed by evaporation under reduced pressure at 70° C. to afford linear siloxane compound C-2 represented by formula (8) as component (C). Linear siloxane compound C-2 was analyzed by GPC under the following conditions and found to have an Mw of 20,000. GPC analysis hereinafter described was carried out under these conditions.
GPC conditions:
Column: TSK-GEL MULTIPORE HXLM, 7.8 mm×300 mm
Developing solvent: tetrahydrofuran Synthesis Example 6

Synthesis of Linear Siloxane Compound C-3 as Component (C)

A hundred part of linear siloxane compound C-2 obtained in Synthesis Example 5 was dissolved in 200 parts of toluene. To the solution were added 20 parts of 1,4-bis (dimethylsilyl)benzene and 0.001 part of a platinum-carbonylvinylmethyl complex (Ossko catalyst), followed by allowing the mixture to react at 70° C. for 2 hours. Twenty parts of 3-vinyl-7-oxabicyclo[4,1,0]heptane was added to the reaction system, followed by stirring at 105° C. for 2 hours. The solvent was removed by evaporation under reduced pressure at 70° C., and the residue was washed with 100 parts of acetonitrile. The solvent was removed by evaporation under reduced pressure at 70° C. to give linear siloxane compound C-3 represented by formula (14) as component (C). Linear siloxane compound C-3 was found to have an Mw of 30,000 as a result of GPC and en epoxy equivalent (molecular weight per epoxy group) of 3000 g/mmol as determined by potentiometric titration according to JIS K7236.

Examples 1 to 21 and Comparative Examples 1 to 3

Preparation and Evaluation of Silicon-Containing Curing Composition

Silicon-containing curing compositions were prepared by mixing a silicon-containing polymer (A), a prepolymer (B), a linear siloxane compound (C), an organic peroxide and/or a metal catalyst (D), and a filler (E) according to the compounding ratios shown in Tables 1 to 3. Each of the resulting compositions was tested to evaluate thermal yellowing resistance, light resistance, occurrence of cracking, cure time, and mechanical characteristics in accordance with the following test methods.

The silicon-containing curing compositions of Examples 1 through 13 and Comparative Examples 1 and 3, which were transparent resin compositions, were tested by test method 1, while those of Examples 14 to 21 and Comparative Example 2, which were white resin compositions, were tested by test method 2.

Test Method 1 (for Transparent Resin Composition)

1. Heat Resistance (Thermal Yellowing Resistance)

A cured product of 50 mm in diameter and 1 mm in thickness was obtained under conditions of 180° C. and 300 seconds in molding and 180° C. and 1 hour in afterbaking. Immediately after the molding, the transmittance at a wavelength of 460 nm was measured using a UV-visible spectrophotometer V-570 (JASCO Corp.). The cured product was then heated in an oven at 180° C. for 100 hours, and the transmission was again measured using V-570. The value calculated using the following formula was taken as thermal yellowing resistance.

Thermal yellowing resistance=[(transmission after heating)/(transmission immediately after molding)]×100

2. Light Resistance

A cured product of 50 mm in diameter and 1 mm in thickness was obtained under conditions of 180° C. and 300 seconds in molding and 180° C. and 1 hour in afterbaking. The transmittance at a wavelength of 460 nm was measured using a UV-visible spectrophotometer V-570 (JASCO Corp.) immediately after the molding and after the cured product was irradiated with UV light for 100 hours using a high pressure mercury lamp. The value calculated using the following formula was taken as light resistance.

Light resistance=[(transmission after UV irradiation)/(transmission immediately after molding)]×100

3. Cracking

A cured product of 50 mm in diameter and 1 mm in thickness was obtained under conditions of 180° C. and 300 seconds in molding and 180° C. and 1 hour in afterbaking. The cured product was left to stand at 180° C. for 100 hours, and the surface was observed with the naked eye.

4. Mechanical Characteristics 4-1. Bending Strength

A cured product of 80 mm in length, 10 mm in width, and 1 mm in thickness was obtained under conditions of 180° C. and 300 seconds in molding and 180° C. and 1 hour in afterbaking. The bending strength of the cured product was determined according to JIS K7171.

4-2. Coefficient of Linear Expansion

A cured product of 5 mm in diameter and 5 mm in thickness was obtained under conditions of 180° C. and 300 seconds in molding and 180° C. and 1 hour in afterbaking. The cured product was subjected to thermomechanical analysis (TMA) to obtain an average linear expansion coefficient in a temperature range of from 40° to 300° C.

Test Method 2 (for White Resin Composition)

1. Heat Resistance (Thermal Yellowing Resistance)

A cured product of 50 mm in diameter and 1 mm in thickness was obtained under conditions of 180° C. and 300 seconds in molding and 180° C. and 1 hour in afterbaking. Immediately after the molding, the reflectance (total reflectance) at a wavelength of 460 nm was measured using a UV-visible spectrophotometer V-570 (JASCO Corp.). The cured product was then heated in an oven at 180° C. for 100 hours, and the reflectance was again measured using V-570. The value calculated using the following formula was taken as light resistance.

Light resistance=[(reflectance after heating)/(reflectance immediately after molding)]×100

2. Light Resistance

A cured product of 50 mm in diameter and 1 mm in thickness was obtained under conditions of 180° C. and 300 seconds in molding and 180° C. and 1 hour in afterbaking. The reflectance (total reflectance) at a wavelength of 460 nm was measured using a UV-visible spectrophotometer V-570 (JASCO Corp.) immediately after the molding and after the cured product was irradiated with UV light for 100 hours using a high pressure mercury lamp. The value calculated using the following formula was taken as light resistance.

Light resistance=[(reflectance after UV irradiation)/(reflectance immediately after molding)]×100

3. Cracking

A cured product of 50 mm in diameter and 1 mm in thickness was obtained under conditions of 180° C. and 300 seconds in molding and 180° C. and 1 hour in afterbaking. The cured product was left to stand at 180° C. for 100 hours, and the surface was observed with the naked eye.

4. Mechanical Characteristics 4-1. Bending Strength

A cured product of 80 mm in length, 10 mm in width, and 1 mm in thickness was obtained under conditions of 180° C. and 300 seconds in molding and 180° C. and 1 hour in afterbaking. The bending strength of the cured product was determined according to JIS K7171.

4-2. Coefficient of Linear Expansion

A cured product of 5 mm in diameter and 5 mm in thickness was obtained under conditions of 180° C. and 300 seconds in molding and 180° C. and 1 hour in afterbaking. The cured product was subjected to TMA to obtain an average linear expansion coefficient in a temperature range of from 40° to 300° C.

4-3. Warpage

A cured product of 50 mm in length, 50 mm in width, and 1 mm in thickness was obtained by molding on a 0.2 mm thick copper plate under conditions of 180° C. and 300 seconds in molding and 180° C. and 1 hour in afterbaking. The cured product on copper plate was placed on a surface plate, and the gap between the surface plate and the edge of the cured product was measured, which was taken as a warpage.

The results of the tests are shown in Tables 1 to 3.

TABLE 1

|  | Example No. | | | | | | | |
| --- | --- | --- | --- | --- | --- | --- | --- | --- |
|  | 1 | 2 | 3 | 4 | 5 | 6 | 7 | 8 |
| Silicon-containing | A-1 | A-1 | A-1 | A-1 | A-1 | A-1 | A-2 | A-1 |
| Polymer (A) | 100 | 100 | 100 | 100 | 100 | 100 | 100 | 100 |

TABLE 1-continued

|  | Example No. |  |  |  |  |  |  |  |
|---|---|---|---|---|---|---|---|---|
|  | 1 | 2 | 3 | 4 | 5 | 6 | 7 | 8 |
| Prepolymer (B) | B-1 | B-1 | B-1 | B-1 | B-1 | B-1 | B-1 | B-1 |
|  | 10 | 80 | 25 | 10 | 10 | 10 | 10 | 25 |
| Linear Siloxane (C) | C-1 | C-2 | C-3 | C-4*[3] | C-5*[4] | C-6*[5] | C-1 | C-3 |
|  | 5 | 20 | 25 | 5 | 5 | 5 | 5 | 25 |
| Organic Peroxide (D) | D-1*[1] | D-1 | D-1 | D-1 | D-1 | D-1 | D-1 | D-2*[6] |
|  | 0.4 | 0.6 | 2 | 0.4 | 0.6 | 1 | 0.2 | 0.1 |
| Metal Catalyst (D) | — | — | — | — | — | — | — | D-3*[7] |
|  |  |  |  |  |  |  |  | 0.2 |
| Filler (E) | E-1*[2] | — | — | E-1 | E-1 | — | E-1 | — |
|  | 50 |  |  | 120 | 300 |  | 300 |  |
| Other(s) | — | — | — | — | — | — | — | — |
| Light Resistance (%) | 95 | 95 | 95 | 95 | 95 | 95 | 95 | 95 |
| Occurrence of Cracking | no | no | no | no | no | no | no | no |
| Bending Strength (MPa) | 50 | 45 | 45 | 55 | 60 | 45 | 60 | 50 |
| Linear Expansion Coefficient (ppm/° C.) | 35 | 50 | 50 | 25 | 20 | 50 | 19 | 50 |
| Thermal Yellowing Resistance — Transmission at 460 nm (%) | 90 | 98 | 98 | 90 | 88 | 96 | 85 | 96 |
| Reflectance at 460 nm (%) | — | — | — | — | — | — | — | — |
| Warpage (mm) | — | — | — | — | — | — | — | — |

*[1] 2,4-Dicumylbenzoyl peroxide
*[2] Aerosil (average particle size: 10 nm)
*[3] DMS-V03 (vinyl-terminated polydimethylsiloxane, from Gelest Inc.)
*[4] VDT-123 (trimethylsiloxy-terminated vinylmethylsiloxane-dimethylsiloxane copolymer, from Gelest Inc.)
*[5] KF-101 (trimethylsiloxy-terminated epoxymethylsiloxane-dimethylsiloxane copolymer, from Shin-Etsu Chemical Co., Ltd.)
*[6] 2,5-Dimethyl-2,5-di(t-butylperoxy)hexane
*[7] Tris(2,4-pentanedionato)aluminum

TABLE 2

|  | Example No. |  |  |  |  |  |  |  |
|---|---|---|---|---|---|---|---|---|
|  | 9 | 10 | 11 | 12 | 13 | 14 | 15 | 16 |
| Silicon-containing Polymer (A) | A-2 | A-2 | A-1 | A-2 | A-1 | A-1 | A-1 | A-1 |
|  | 100 | 80 | 100 | 200 | 80 | 100 | 100 | 100 |
| Prepolymer (B) | — | B-1 | B-1 | — | B-1 | B-1 | B-1 | B-1 |
|  |  | 60 | 10 |  | 70 | 30 | 30 | 30 |
| Linear Siloxane (C) | C-1 | C-1 | C-1 | C-3 | C-2 | C-1 | C-2 | C-3 |
|  | 30 | 5 | 10/ | 10 | 5/ | 10/ | 10 | 10/ |
|  |  |  | C-6 |  | C-6 | C-6 |  | C-6 |
|  |  |  | 10 |  | 10 | 5 |  | 5 |
| Organic Peroxide (D) | D-1 | D-2 | D-2 | D-1 | D-2 | D-1 | D-1 | D-1 |
|  | 0.2 | 0.1 | 1 | 0.5 | 1 | 0.5 | 0.5 | 0.5 |
| Metal Catalyst (D) | — | D-4*[8] | D-3 | — | D-4 | — | — | — |
|  |  | 1 | 0.05 |  | 0.1 |  |  |  |
| Filler (E) | — | — | — | — | — | E-2*[10] | E-2 | E-2 |
|  |  |  |  |  |  | 100/ | 300/ | 100/ |
|  |  |  |  |  |  | E-3*[11] | E-3 | E-3 |
|  |  |  |  |  |  | 850 | 850 | 850 |
| Other(s) | — | — | — | F-1*[9] | — | — | — | — |
|  |  |  |  | 10 |  |  |  |  |
| Light Resistance (%) | 95 | 95 | 95 | 95 | 95 | 98 | 98 | 98 |
| Cracking | no | no | no | no | no | no | no | no |
| Bending Strength (MPa) | 50 | 45 | 45 | 45 | 50 | 65 | 65 | 65 |
| Linear Expansion Coefficient (ppm/° C.) | 50 | 40 | 40 | 50 | 40 | 18 | 18 | 18 |
| Thermal Yellowing Resistance — Transmission at 460 nm (%) | 95 | 95 | 95 | 95 | 95 | 55 | — | — |
| Reflectance at 460 nm (%) | — | — | — | — | — | 97 | 97 | 97 |
| Warpage (mm) | — | — | — | — | — | concave warpage 0.5 | concave warpage 0.6 | concave warpage 0.5 |

*[8] Platinum-divinyltetramethyldisiloxane complex (Karsted's catalyst)
*[9] Cyclic siloxane compound of formula (19)
*[10] Titanium oxide (average particle size: 0.25 μm)
*[11] Fused silica (average particle size: 12 μm

TABLE 3

| | Example No. | | | | | Comparative Example No. | | |
|---|---|---|---|---|---|---|---|---|
| | 17 | 18 | 19 | 20 | 21 | 1 | 2 | 3 |
| Silicon-containing Polymer (A) | A-1<br>100 | A-1<br>100 | A-1<br>100 | A-2<br>100 | A-1<br>80 | A-1<br>100 | A-1<br>100 | A-1<br>100 |
| Prepolymer (B) | B-1: 30 | B-1: 30 | B-1: 30 | — | B-1: 70 | B-1: 25 | B-1: 30 | B-1: 10 |
| Linear Siloxane (C) | C-4: 10<br>C-6: 5 | C-5<br>10 | C-6<br>10 | C-3<br>30 | C-2: 5<br>C-6: 5 | — | — | C-1<br>2 |
| Organic Peroxide (D) | D-1: 0.5 | D-1: 0.5 | D-1: 0.5 | D-1: 0.2 | D-2: 1.0 | D-2: 1.0 | D-1: 0.5 | — |
| Metal Catalyst (D) | — | — | — | — | D-4: 0.1 | D-3: 0.2 | — | — |
| Filler (E) | E-2: 100<br>E-3: 850 | E-2: 100<br>E-3: 850 | E-2: 100<br>E-3: 850 | E-3: 700<br>E-4*[12]: 200 | E-1: 400<br>E-4: 200<br>E-5*[13]: 200 | — | E-2: 100<br>E-3: 850 | E-1<br>50 |
| Other(s) | — | — | — | — | — | — | F-1: 10 | — |
| Light Resistance (%) | 98 | 98 | 98 | 98 | 98 | 97 | 97 | 97 |
| Cracking | no | no | no | no | no | yes | no | yes |
| Bending Strength (MPa) | 60 | 60 | 60 | 60 | 60 | 45 | 50 | 40 |
| Linear Expansion Coefficient (ppm/° C.) | 18 | 17 | 17 | 17 | 17 | 50 | 18 | 50 |
| Thermal Yellowing Resistance — Transmission at 460 nm (%) | — | — | — | — | — | 95 | — | 90 |
| Thermal Yellowing Resistance — Reflectance at 460 nm (%) | 97 | 97 | 97 | 96 | 97 | — | 96 | — |
| Warpage (mm) | concave warpage 0.5 | concave warpage 0.6 | concave warpage 0.5 | concave warpage 0.5 | concave warpage 0.5 | — | concave warpage 3.0 | — |

*[12]Titanium oxide/calcium carbonate composite (average particle size: 1 μm)
*[13]Alumina (average particle size: 3 μm)

It is apparent from the results in Tables 1 to 3 that the cured product of the silicon-containing curing composition of the invention is excellent in heat resistance, light resistance, crack resistance, mechanical strength, and curability.

The invention claimed is:

1. A silicon-containing curing composition comprising:
(A) 100 parts by mass of a silicon-containing polymer having a weight average molecular weight of 300 to 100,000 obtained by hydrolysis and condensation of an organosilane mixture comprising (a) 5 to 50 mol % of one or more than one organosilane represented by general formula (1-1), (b) 0 to 50 mol % of one or more than one organosilane represented by general formula (1-2), (c) 0 to 40 mol % of one or more than one organosilane represented by general formula (1-3), (d) 0 to 50 mol % of one or more than one organosilane represented by general formula (1-4), and (e) 0 to 40 mol % of one or more than one organosilane represented by general formula (1-5), the sum of the organosilane (b) and the organosilane (c) being 5 to 60 mol %;
(B) 10 to 80 parts by mass of a prepolymer containing at least two Si—H groups per molecule obtained by hydrosilylation between (α) at least one compound selected from a cyclic siloxane compound represented by general formula (2) and (β) at least one compound selected from a compound represented by general formula (3-1), a compound represented by formula (3-2), and a compound represented by general formula (3-3), a ratio of a number X of the Si—H groups in component (α) to a number Y of carbon-carbon double bonds in component (β) reactive with the Si—H groups is X:Y is 10:1 to 2:1, an Si—H group concentration being 5.3 mmol/g, and having a weight average molecular weight of 140,000;
(C) 5 to 30 parts by mass of a linear siloxane compound containing at least two carbon-carbon double bonds reactive with an Si—H group or an Si—CH₃ group per molecule of general formulas (5) to (14);

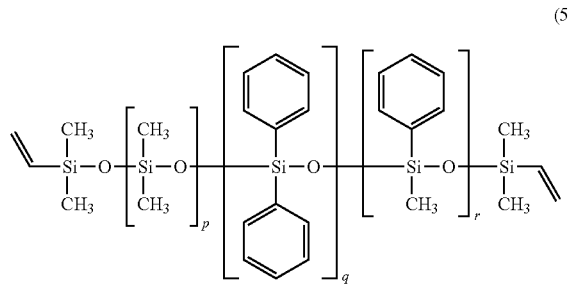

(5)

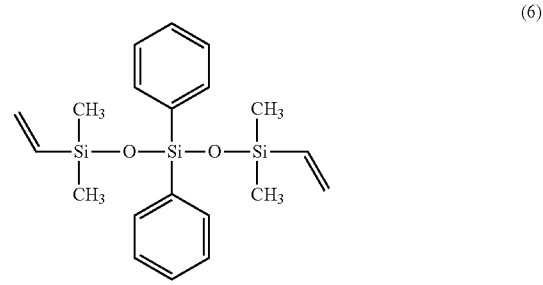

(6)

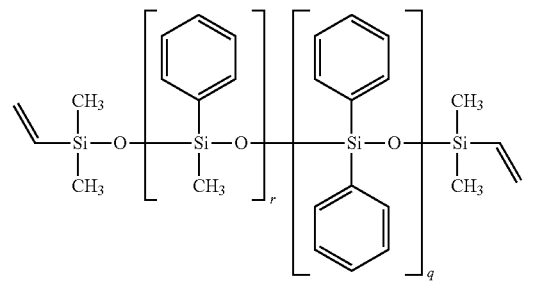

(7)

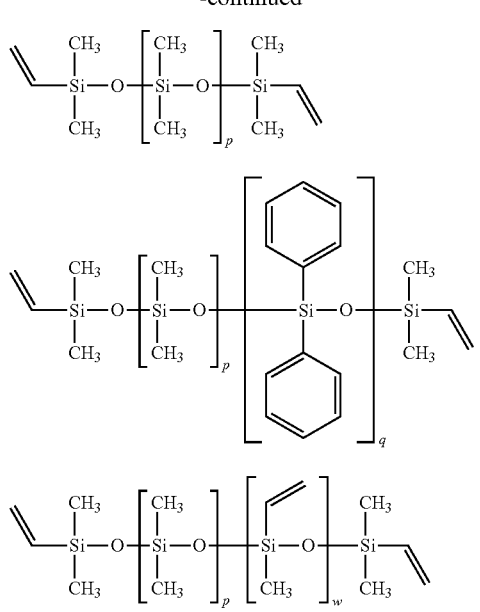

where p, q, r and w each independently represent a number of from 0 to 3000 and p+q+r+w≥1, (D) 0.1 to 2 parts by mass of an organic peroxide and 0 to 1.0 part by mass of a metal catalyst; and (E) 0 to 700 parts by mass of a silica or titanium dioxide filler having an average particle size of 0.1 to 80 μm, $R^1SiX_3$ (1-1)

$R^2SiX_3$ (1-2)

$R^3R^4SiX_2$ (1-3)

$R^5SiX_3$ (1-4)

$R^6SiX_3$ (1-5)

wherein $R^1$ represents an alkenyl group having 2 to 6 carbon atoms; $R^2$ represents a hydrogen atom or an alkyl group having 1 to 6 carbon atoms; $R^3$ and $R^4$ each independently represent a hydrogen atom or an alkyl group having 1 to 6 carbon atoms, an alkenyl group having 2 to 6 carbon atoms, or a phenyl group optionally substituted with an alkyl group having 1 to 6 carbon atoms; at least one of $R^2$, $R^3$, and $R^4$ is a methyl group; $R^5$ represents a phenyl group optionally substituted with an alkyl group having 1 to 6 carbon atoms; $R^6$ represents an epoxy group having 2 to 10 carbon atoms; and X represents a hydroxyl group, an alkoxy group having 1 to 6 carbon atoms, or a halogen atom (2)

wherein $R^7$, $R^8$, and $R^9$ each independently represent an alkyl group having 1 to 6 carbon atoms or a phenyl group optionally substituted with an alkyl group having 1 to 6 carbon atoms; f$R^7$'s may be the same or different; g$R^8$'s may be the same or different; g$R^9$'s may be the same or different; f represents a number of 2 to 10; g represents a number of 0 to 8; and f+g≥2

(3-1)

(3-2)

(3-3)

wherein $R^{10}$ represents an alkenyl group having 2 to 10 carbon atoms; $R^{11}$ and $R^{12}$ each independently represent an alkyl group having 1 to 10 carbon atoms, an alkenyl group having 2 to 10 carbon atoms, or an epoxy group having 2 to 10 carbon atoms; and n represents 1 or 2.

2. A cured product obtained by curing the silicon-containing curing composition according to claim 1.

3. The silicon-containing curing composition according to claim 1, wherein the organic peroxide is selected from the group consisting of benzoyl peroxide, o-methylbenzoyl peroxide, p-methylbenzoyl peroxide, o-monochlorobenzoyl peroxide, p-monochlorobenzoyl peroxide, bis(2,4-dichlorobenzoyl) peroxide, 2,4-dicumylbenzoyl peroxide, di(t-butylbenzoyl) peroxide, t-butyl benzoate, t-butylcumylbenzoyl peroxide, 1, 1-bis(t-butylperoxy)-3,3,5-trimethylcyclohexane, 2,5-dimethyl-2,5-di(t-butylperoxy)hexane, 1,6-bis(t-butyl peroxycarboxy)hexane, dicumyl peroxide, dimyristyl peroxycarbonate, t-butylperoxy 2-ethylhexylcarbonate, dicyclododecylperoxy dicarbonate, and compounds represented by general formula (15) or (15'):

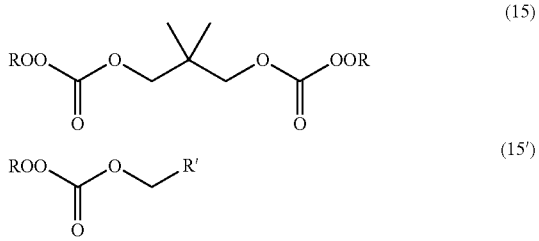

wherein R and R' each independently represent a hydrocarbon group having 3 to 10 carbon atoms.

4. The silicon-containing curing composition according to claim 1, wherein the organic peroxide is selected from the group consisting of benzoyl peroxide and 2,4-dicumylbenzoyl peroxide.

5. The silicon-containing curing composition according to claim 1, wherein a metal catalyst is selected from the group consisting of tris(2,4-pentanedionato)aluminum, Al(acac)$_3$, Al(O-i-Pr)$_3$, Al(ClO$_4$)$_3$, Ti(O-i-Pr)$_4$, Ti(O-i-Bu)$_4$, Bu$_2$Sn(acac)$_2$, and Bu$_2$Sn(C$_7$H$_{15}$COO)$_2$, platinum-carbonylvinylmethyl complex, and platinum-divinyltetradimethyldisiloxane complex.

6. The silicon-containing curing composition according to claim 1, wherein the filler is an inorganic filler treated with a coupling agent selected from the group consisting of dimethyldimethoxysilane, dimethyldiethoxysilane, methylethyldimethoxysilane, methylethyldiethoxysilane, methyltrimethoxysilane, methyltriethoxysilane, ethyltrimethoxysilane, and ethyltrimethoxysilane; alkenyl-functional alkoxysilanes, vinyltrichlorosilane, vinyltrimethoxysilane, vinyltriethoxysilane, allyltrimethoxysilane, epoxy-functional alkoxysilanes, 3-methacryloxypropyltriethoxysilane, 3-methacryloxypropyltrimethoxysilane, 3-methacryloxypropylmethyldiethoxysilane, 3-methacryloxypropylmethyldimethoxysilane, 2-methacryloxypropyltrimethoxysilane, γ-glycidoxypropyltrimethoxysilane, γ-glycidoxypropylmethyldiethoxysilane, β-(3,4-epoxycyclohexyl)ethyltrimethoxysilane; amino-functional alkoxysilanes, N-β(aminoethyl)-γ-aminopropyltrimethoxysilane, γ-aminopropyltriethoxysilane, N-phenyl-γ-aminopropyltrimethoxysilane, mercapto-functional alkoxysilanes, γ-mercaptopropyltrimethoxysilane, titanium alkoxides, titanium tetraisopropoxide, titanium tetra-n-butoxide, titanium chelates, titaniumdioctyloxybis(octylene glycolate), titanium diisopropoxybis(ethylacetoacetate), zircomum chelates, zirconium tetraacetylacetonate, zirconium tributoxymonoacetylacetonate, Zirconium acylates, zirconium tributoxymonostearate, isocyanate silanes, and methyltriisocyanate silane.

7. The silicon-containing curing composition according to claim 1, wherein X:Y in component (B) is 4:1 to 2:1.

8. The silicon-containing curing composition according to claim 1, having a light resistance of 95% and no cracking or warpage.

9. The silicon-containing curing composition according to claim 1, having a bending strength of 45-60 MPa.

10. The silicon-containing curing composition according to claim 1, having a linear expansion coefficient of 19-50 ppm/° C.

* * * * *